(12) United States Patent
Chen

(10) Patent No.: US 6,191,023 B1
(45) Date of Patent: Feb. 20, 2001

(54) METHOD OF IMPROVING COPPER PAD ADHESION

(75) Inventor: Sheng-Hsiung Chen, Taichung County (TW)

(73) Assignee: Taiwan Semiconductor Manufacturing Company, Hsin-Chu (TW)

(*) Notice: Under 35 U.S.C. 154(b), the term of this patent shall be extended for 0 days.

(21) Appl. No.: 09/442,497

(22) Filed: Nov. 18, 1999

(51) Int. Cl.[7] ................................................. H01L 21/44
(52) U.S. Cl. ........................... 438/612; 438/618; 438/625
(58) Field of Search .................... 257/782, 784, 257/774, 751; 438/118, 617, 629, 637, 627, 612, 618, 622, 625

(56) References Cited

U.S. PATENT DOCUMENTS

| | | | |
|---|---|---|---|
| 5,309,025 | 5/1994 | Bryant et al. | 257/784 |
| 5,547,901 | 8/1996 | Kim et al. | 437/187 |
| 5,631,498 | 5/1997 | Anschel et al. | 257/690 |
| 5,668,411 | 9/1997 | Hong et al. | 257/751 |
| 5,700,735 | 12/1997 | Shine et al. | 438/612 |
| 5,707,894 | 1/1998 | Hsiao | 437/209 |
| 5,785,236 | 7/1998 | Cheung et al. | 228/180.5 |
| 5,795,796 | 8/1998 | Kim | 437/189 |
| 5,807,787 | 9/1998 | Fu et al. | 438/623 |
| 5,834,365 | 11/1998 | Ming-Tsung et al. | 438/612 |
| 5,904,565 | 5/1999 | Nguyen et al. | 438/687 |

*Primary Examiner*—Roy Potter
(74) *Attorney, Agent, or Firm*—George O. Saile; Stephen B. Ackerman

(57) ABSTRACT

This invention relates to a new improved method and structure in the fabricating of aluminum metal pads. The formation special aluminum bond pad metal structures are described which improve adhesion between the tantalum nitride pad barrier layer and the underlying copper pad metallurgy by a special interlocking bond pad structure. It is the object of the present invention to provide a process wherein a special grid of interlocking via structures is placed in between the underlying copper pad metal and the top tantalum nitride pad barrier layer providing improved adhesion to the aluminum pad metal stack structure. This unique contact bond pad structure provides for thermal stress relief, improved wire bond adhesion to the aluminum pad, and prevents peeling during wire bond adhesion tests.

33 Claims, 3 Drawing Sheets

METHOD OF IMPROVING COPPER PAD ADHESION

BACKGROUND OF THE INVENTION

1. Field of the Invention

This invention relates to a method of fabrication used for semiconductor integrated circuit devices, and more specifically to the formation of aluminum pad metal structures are described which improve adhesion between the tantalum nitride pad barrier layer and the underlying copper pad metallurgy by a special interlocking via structure. It is the object of the present invention to provide a process wherein a special grid of interlocking via structures is placed in between the underlying copper pad metal and the top tantalum nitride pad barrier layer providing improved adhesion to the aluminum pad metal stack structure. This unique contact pad structure provides for thermal stress relief, improved wire bond adhesion to the aluminum pad, and prevents peeling during wire bond adhesion tests.

As a background to the current invention, with the continuous shrinking of device dimensions, copper has been the most attractive material for interconnects. Before packaging of the chip, wire bonding is a serious problem when using gold wire bonding directly to a copper pad. Tantalum nitride has been commonly used as the barrier material for copper metallization in combination with an aluminum wire bond pad structure. A "standard" damascene process is used with copper interconnect metallization and large copper pad contacts to tungsten plugs. For better adhesion, the "convention" solution is the addition of tantalum nitride, TaN, as a barrier layer and the deposition of an AlCu pad on the surface. However, using this method is only a partial solution to the wire bonding problem. This invention describes a new method for improved wire bond pad adhesion in which a special via hole interlocking structure is fabricated between the TaN barrier layer and Al pad structure.

2. Description of Related Art

The present invention is a new and improved method for fabricating aluminum metal bond pad structures wherein specifically to the formation of aluminum bond pad metal structures are described which improve adhesion among the tantalum nitride pad barrier layer, top aluminum and the underlying copper pad metallurgy by using a special interlocking via structure. Related Prior Art background patents will now be described in this section.

U.S. Pat. No. 5,700,735 (Shiue et al.) teaches the formation of via plugs between the top metal layer and the pad. A bond pad structure and method of forming the bond pad structure is described which provides for reliable interconnections between the bond pad structure and the next level of circuit integration. The bond pad structure uses three metal pads separated by layers of dielectric. Via plugs are formed between the first and second metal pads and between the second and third metal pads. The via plugs are formed in a diamond shape with respect to the metal pads. The metal pads are squares with the same orientation. The periphery of the via plugs forms a square rotated 45 degrees with respect to the square metal pads.

U.S. Pat. No. 5,707,894 (Hsiao) teaches the formation anchor pads under the pad for better adhesion properties. A structure and a process for forming an improved bonding pad is described which resists bond pad peeling of between the bonding pad layer and the underlying layer. The method comprises forming plurality of anchor pads on said substrate surface in a bonding pad area. Next, a first insulating layer is formed over said substrate surface and the anchor pads. Vias are formed through the first insulating layer. The vias are filled with a second metal layer making a connection to the anchor pads and the first insulating layer is covered in the bonding pad area with the second metal layer. It is important that the via holes have a smaller cross sectional area than the anchor pads so that the combination of the anchor pads and the second metal form small "hooks" into the first insulating layer that hold the second metal (bonding pad layer) to the underlying layer.

U.S. Pat. No. 5,807,767 (Fu et al.) teaches a method of forming a pad with reduced electrical leakage. A method is described for reducing the surface leakage current between adjacent bonding pads on integrated circuit substrates after forming a patterned polyimide passivation layer. When the polyimide layer is patterned to open contacts areas over the bonding pads, plasma ashing in oxygen is used to remove residual polyimide that otherwise causes high contact resistance, and poor chip yield. This plasma ashing also modifies the insulating layer between bonding pads resulting in an unwanted increase in surface leakage currents between bonding pads. The passivation process is improved by using a thermal treatment step in either a nitrogen or air ambient after the plasma ashing to essentially eliminate the increased surface leakage current and improve chip yield.

U.S. Pat. No. 5,834,365 (Ming-Tsung et al.) describes a method to form contour stripes under the Al pad layer to create an irregular surface. A structure and a process for forming an improved bonding pad is described which allows for better bonding between a bond wire and a metal bonding pad. Stripes are formed on a substrate. A conformal dielectric layer, a conformal barrier layer and a metal layer are formed over the stripes. A passivation layer with a window is formed defining a bonding pad area. The stripes promote an irregular surface in the barrier and metal layers which reduce stress between the dielectric layer, the barrier layer and the metal layer. Also, the irregular surfaces increase the barrier metal adhesion to the dielectric layer, reduce bond pad peel off, and increase bonding yields.

U.S. Pat. No. 5,309,025 (Bryant et al.) describes conductive lines under the pad which form an irregular pad surface to improve bond pad adhesion. A bond pad structure is formed by depositing a barrier layer over an underlying region of a semiconductor device, and then depositing a first conductive layer over the barrier layer. The barrier layer and conductive layer are then patterned and etched to define a conductive region. In a preferred embodiment, the conductive region is formed in the shape of a grid. A second conductive layer is deposited over the conductive region and a portion of the exposed underlying region. The second conductive layer makes a good adhesive contact with the underlying region, thus preventing bond pad lift off.

U.S. Pat. No. 5,904,565 (Nguyen et al.) describes an interconnect process with multiple conductive and non-conductive barrier layers. A method of forming a direct, copper-to-copper, connection between levels in an IC is disclosed. A via interconnection is formed by isotropically depositing a barrier material in a via through an insulator to a lower copper level, and then anisotropically etching the via to remove the barrier material covering the lower copper level. The anisotropic etch leaves the barrier material lining the via through the insulator. The subsequently deposited upper metal level then directly contacts the lower copper level when the via is filled. A dual damascene interconnection is formed by etching an interconnection trench in an insulator and anisotropically depositing a non-conductive barrier material in the trench bottom. Then a via is formed from the trench interconnect to a lower copper level. As above, a conductive barrier material is isotropically deposited in the trench/via structure, and anisotropically etched to remove the barrier material covering the lower copper level. The insulating barrier material, lining the trench and via, remains. An IC via interconnection structure and a dual damascene interconnection structure, made in accordance with the above described methods, are also provided.

U.S. Pat. No. 5,795,796 (Kim) shows an Al interconnect with a TaN barrier layer. A method of fabricating a metal line includes the steps of preparing a semiconductor substrate, depositing a first metal on the semiconductor substrate, heat-treating the first metal to form a first metal nitride layer. depositing a second metal on the first metal nitride layer. heat treating the second metal. depositing a third metal on the second metal, and heat treating both the third metal and the second metal to form a metal insulating layer in which the second and the third metals are mixed. The method of fabricating increases the area occupied by the metal line in a contact hole, decreases contact resistance, and increases the speed of the device.

U.S. Pat. No. 5,668,411 (Hong at al.) shows a Al/TaN/Al structure with an anneal step. A diffusion barrier trilayer is comprised of a bottom layer, a seed layer and a top layer. The diffusion barrier trilayer prevents reaction of metallization layer with the top layer upon heat treatment, resulting in improved sheet resistance and device speed.

U.S. Pat. No. 5,785,236 (Cheung et al.) shows an Al pad over a Cu interconnect. A process is provided which enables electrical connection to be formed between gold and aluminum wires and copper interconnects. Conventional techniques for wire bonding are ineffective for bonding gold wires or aluminum wires to copper pads or copper interconnects. A process is provided to modify the copper pads so that conventional wire bonding techniques can be employed. In the process of the present invention an aluminum pad is formed over the copper interconnects. The metal wire is then bonded to the aluminum pad using conventional wire bonding techniques. No new hardware and/or technology is required for the metal wire bonding. No new technology is required to integrate the process of the invention into existing IC fabrication processes.

U.S. Pat. No. 5,547,901 (Kim et al.) shows a Cu wire with an Al oxide containing barrier layer. A method for forming a metal wiring of a semiconductor element, which uses an aluminum film as an oxidation prevention film to prevent oxygen from being diffused into copper contained in the metal wiring. An aluminum oxidation prevention film-layer is selectively formed on an exposed surface of the copper metal wiring layer using a selective chemical vapor deposition method. The width of the aluminum layer formed is below 100 Angstroms, and is converted into aluminum oxide with heat treating or under an atmosphere, thereby preventing the copper from oxidation. A diffusion prevention film between the substrate and the copper metal wiring layer is further included for preventing the copper from diffusing into the substrate.

U.S. Pat. No. 5,631,498 titled "Thin Film Metallization Process For Improved Metal To Substrate Adhesion" granted to Anchel, Ormond and Hayunga on May 20, 1997 describes a metallization layer formed on a substrate with improved adhesion thereto, by performing the deposition at an elevated temperature which favors the formation of chemical bonds of the metal to the substrate as well as clusters of metal embedded within the substrate and contiguous with the metallization layer. In polymer substrates the chemical bond is made to carbonyl functional groups such as ketones or aldehydes. The adhesion is enhanced by the removal of moisture from the surface of the substrate at the elevated temperatures employed. A high degree of adhesion is also obtained through the deposition of a mixture of metals including chromium and copper which initially has a high chromium to copper ratio which is decreased during the deposition process. Completion of the process is determined by the reaching of a final desired chromium to copper ratio as observed by optical emission spectroscopy. The process can be carried out on a continuous basis by the use of a multi-chamber vacuum sputtering system, cluster system or in-line system. The process is compatible for wire bond pads, direct solder flip chip attachment (C4's), and direct pin attachment processes.

The present invention is directed to a novel and improved method of fabricating metal pad structures. The method of the present invention requires less processing time, has lower cost than conventional methods and produces robust unique metal pad "interlocking" structures with good adhesion properties, low thermal stress and good conductivity.

SUMMARY OF THE INVENTION

It is a general object of the present invention to provide a new and improved method for fabricating aluminum metal pad structures wherein a new and improved method and interlocking grid structure is fabricated for improved adhesion through wire bond processing. A "standard" damascene process is used with copper interconnect metallization and large copper pad contacts to tungsten plugs (not shown in Figs.). For better adhesion, the "convention" solution is the addition of tantalum nitride, TaN, as a barrier layer and the deposition of an AlCu pad on the surface. However, using this method is only a partial solution to a wire bonding adhesion problem. This invention describes a new method for improved wire bond pad adhesion in which a special via hole interlocking grid structure is fabricated between the TaN barrier layer and Al pad structure.

As background to this invention, provided by Prior Art methods are: a semiconductor silicon substrate (or an IC module) with the first level of metal copper wiring being defined, embedded in the first layer of insulator, typically silicon oxide $SiO_x$. The invention starts with these conventional layers being provided by Prior Art methods. Also provided by Prior Art methods, can be a metal "seed layer" and metal diffusion barrier layer beneath the metal copper wiring layers. (These seed and barrier layers are thin film adhesion layers or layer, not shown in the Figs.). In addition, the first level metal is placed on an interlevel dielectric (ILD) insulating layer (an interconnect line layer, or device contact region to P-N junctions), provided by Prior Art methods.

The key embodiments of this present invention, which solve the deleterious adhesion problems, are now presented. As stated above, provided are a substrate, an insulating layer, an underlying copper layer defined as the start of the pad structure. The key process step to this invention is the deposition, patterning and defining of an interlocking grid structure composed of deposited, passivating material. The passivating material is typically defined by patterning photoresist. Spaces are etched by reactive ion etch (RIE) between the interlocking island or structures (an array of these structures are formed).

Referring in more detail to this interlocking grid structure and method for the formation of metal pad structures, more description now follows. These interlocking structures form "islands" of interlocking "grid" structures (an array in three dimensions) to enhance adhesion among the various layer of the metal stack pad structure for improved wire bond strength. The method and structure of said interlocking grid structure is formed by the patterning and etching of a passivation material, e.g., insulating silicon oxide, silicon nitride, polyimide material, etc.. The said interlocking grid structure is then formed in a pad via contact region is , approximately 100 by 100 microns square and the size of the island structures are from about 10 to 25 microns in width, approximately 4 microns in height, and from about 4 to 10 in number per contact via pad structure. The said interlocking grid structure, formed in a pad via contact region forms an array in three dimensions said "grid", group or an array of interlocking structures ("islands").

The next key step of this invention, in yet another embodiment, is the deposition, patterning and etching of the metal barrier layer directly upon the via contact region, in the formation of the metal pad structure. The barrier layer deposition conforms to the interlocking island grid structures for improved adhesion. The metal barrier layer consists of thin layer of material, i.e., tantalum nitride.

Prior to the deposition of the metal barrier layer, the photoresist used to define the interlocking structure is etched-off or "stripped".

Next in the process sequence, is the completion of the metal pad stack structure with interlocking (islands) grid structure, as the main embodiment of this present invention. For completeness, as described above are provided in the metal stack pad structure: the substrate, an insulating layer, an the underlying copper layer. As stated earlier, the said key process step to this invention is the deposition, patterning and defining of a special passivation interlocking (grid) structures placed directly on top of the underlying copper metallurgy. In addition, in the structure is the patterned and defined barrier metal layer placed directly on top of interlocking structures. A final step in the process is deposition, patterning and definition of the aluminum pad metallurgy to form the top metal pad on top of the interlocking grid structure. This interlocking pad process and structure provides robust pad metal (stack) structures that having good adhesion properties (no metal or interface separation/peel failures, interface fracture failures). Since there are a large statistical number of these structures, failure rates must be very low and reliability very high, as tested by gold wire bond pull tests. Temperature and humidity cycling tests indicate the robustness of the process and structure from stress-crack corrosion, peeling, interface failure, adhesion failures, etc..

A "standard" gold wire bond pull test structure was used to evaluate the present invention's robust pad structures. For a standard pull test of metal adhesion strength (referred to as a manufacturing use test). An end portion of a 1.28 milli-inch diameter gold wire is bonded to the surface of the aluminum metal pad and tension applied thereto, at an angle of 90 degrees to the surface (to prevent shear). The diameter of the wire determines a standardized adhesion strength if the wire is broken first, at the tensile strength of the wire, before the pad is pulled away or peeled from the underlying structure. If the wire breaks (wire necking), it leaves a bonded portion called a nugget attached to the pad. It is considered that sufficient bonding has been achieved to develop adhesion that can withstand repeated thermal, humidity (T&H) and/or mechanical stress of the degree encountered during the testing and manufacturing. However, if a failure occurs between the metal and any interface in the structure (by peeling, fracture, interface failure) at a force less than that required to break the wire adhesion is considered to be of a significantly low value which it will be deleterious to the reliability of the product. Wire (bond) pull tests were conducted to a large numbers of pads, to be statistically significant, to prove the robustness of the invention's process and interlocking grid (islands) structure for good adhesion properties. (Note for completeness and to show diligence, low power wire bonding was performed, so as note to influence the pad structure.)

In summary, the present invention is a new and improved method for fabricating aluminum metal pad structures wherein the formation of aluminum pad metal structures are described which improve adhesion between the tantalum nitride pad barrier layer and the underlying copper pad metallurgy by special interlocking grid ("islands") via structures. It is the object of the present invention to provide a process wherein a special grid of interlocking via structures is placed in between the underlying copper pad metal and the top tantalum nitride pad barrier layer providing improved adhesion to the aluminum pad metal stack structure. This unique contact pad structure provides for thermal stress relief, improved wire bond adhesion to the aluminum pad, and prevents peeling during wire bond adhesion tests.

The problem of adhesion of metal pad to underlying layers, dielectrics, and polymers in is not unique to the manufacture of multi-layer electronic circuit chips and modules, but is encountered in other technologies involved in other types of electronic elements, e.g., the formation of capacitors or even other technologies entirely unrelated to the fabrication of electrical devices. However, since the problems of loss of adhesion are of substantial economic importance at present in the fabrication of multi-layer chips and modules, the present invention is directed to silicon chip technology and IC modules, but can be easily applied to other technologies using these metal pad materials and special interlocking ("islands") grid structures.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The present invention is a new and improved method for fabricating aluminum metal pad structures. A "standard"

damascene process is used with copper interconnect metallization and large copper pad contacts to tungsten plugs (not shown in Figs.). For better adhesion, the "convention" solution is the addition of tantalum nitride, TaN, as a barrier layer and the deposition of an AlCu pad on the surface. However, using this method is only a partial solution to the wire bonding problem. This invention describes a new method for improved wire bond pad adhesion in which a special via hole interlocking structure is fabricated between the TaN barrier layer and Al pad structure.

Figure 1:
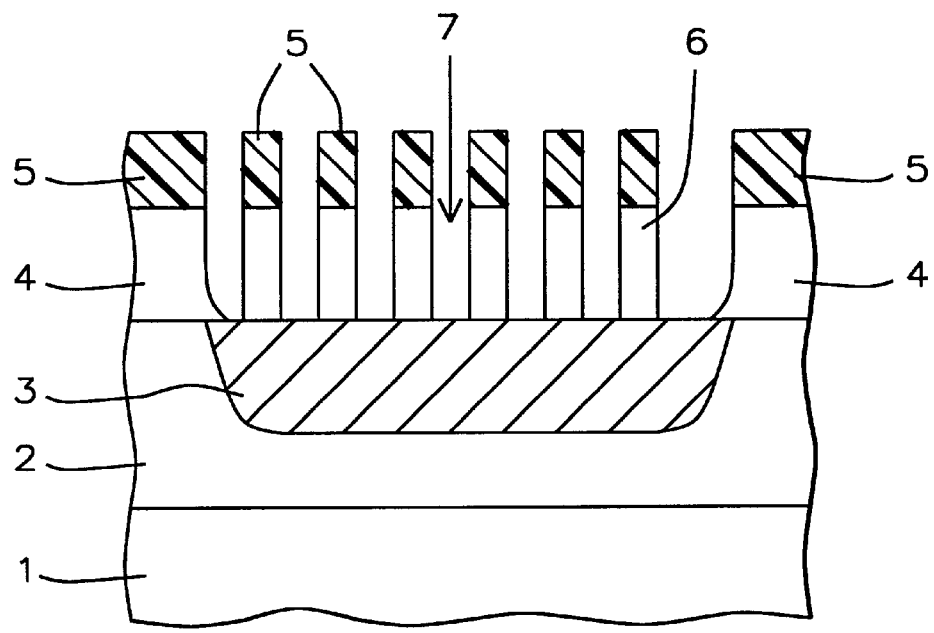
FIG. 1, which in cross-sectional representation illustrates a key process step of this invention, the defining and etching of a grid of special interlocking pad structures for improved metal pad stack adhesion.

Referring to FIG. 1, which in cross-sectional representation, shows a semiconductor silicon substrate 1 (or an IC module) with the first level of metal copper wiring 3 being defined, embedded in the first layer of insulator 2, typically silicon oxide $SiO_x$. The invention starts with these conventional layers being provided by Prior Art methods. Also provided by Prior Art methods, can be a metal "seed layer" and metal diffusion barrier layer beneath the metal copper wiring layers. (These seed and barrier layers are thin film adhesion layers or layer, not shown in the Figs.). In addition, the first level metal 3 is placed on an interlevel dielectric (ILD) insulating layer 2 (an interconnect line layer, or device contact region to P-N junctions), provided by Prior Art methods.

Referring to again to FIG. 1, in cross-sectional enlarged sketch of a microscopic region of the pad structure, the key embodiments of this present invention are presented. Provided are the substrate 1, insulating layer 2. The underlying copper layer 3 is depicted. The key process step to this invention is the deposition, patterning and defining of interlocking "island" structures 6 of deposited, passivating material 4. The passivating material is defined by patterning photoresist 5. Etched spaces 7 between the island structures are shown in FIG. 1. The passivation material (4) is, for example, silicon dioxide and silicon nitride in a thickness range from about 10,000 to 15,000 Angstroms, deposited by chemical vapor deposition (CVD) with deposition conditions of temperature between 300 to 380° C. and at a pressure of between 1 to 100 Torr Referring again, in more detail to FIG. 1, a method and structure (in the fabrication of metal pad structures) is shown wherein a unique interlocking grid structure is formed. These interlocking structures form "islands" of interlocking "grid" structures (in three dimensions) to enhance adhesion among the various layer of the metal stack pad structure for improved wire bond strength. The method and structure of said interlocking grid structure 6 is formed by the patterning and etching of passivation material 4, e.g., insulating silicon oxide, silicon nitride, polyimide material, etc.. The said interlocking grid structure 6 is formed in a pad via contact region is , approximately 100 by 100 microns square and the size of the "island" structures are from about 10 to 25 microns in width, approximately 4 microns in height, and from about 4 to 10 in number per contact via pad structure. The said interlocking grid structure 6, formed in a pad via contact region forms in three dimensions, a "grid", group or an array of interlocking structures ("islands").

Figure 2:
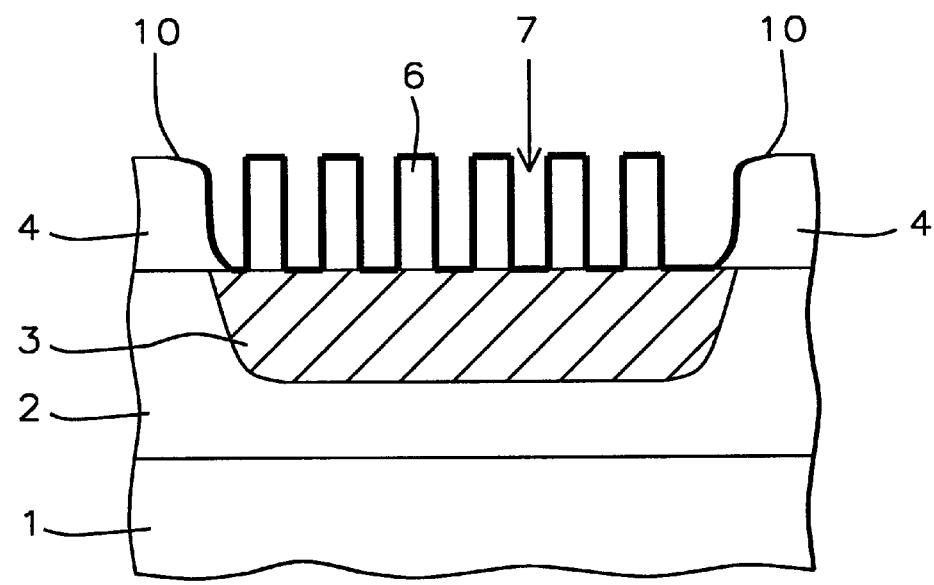
FIG. 2, which in cross-sectional representation illustrates a another key process step of this invention: the deposition, patterning and defining of a thin barrier metal layer, e.g., tantalum nitride over the interlocking special via pad structures.

Referring to FIG. 2, in cross-sectional sketch is shown the next key step of this invention, the deposition, patterning and etching of the metal barrier layer 10 upon the via contact region, in the formation of the metal pad structure. The barrier layer deposition conforms to the interlocking "island" grid structures for improved adhesion. The metal barrier layer consists of thin layer of material, i.e., tantalum nitride. Prior to the deposition of the metal barrier layer, the photoresist used to define the interlocking structure is etched-off or "stripped".

Figure 3:
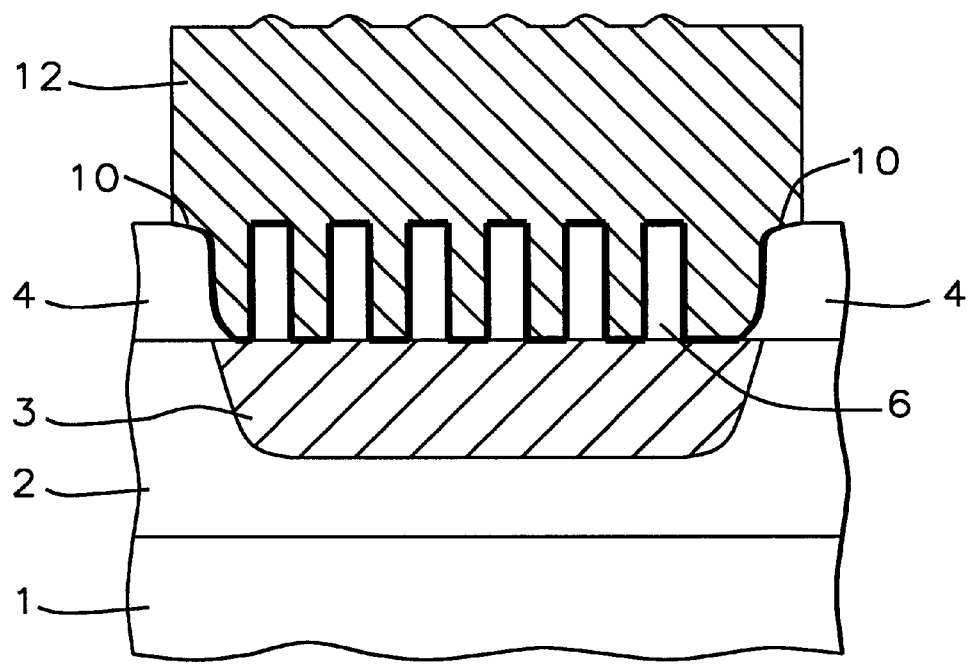
FIG. 3, which in cross-sectional representation illustrates another key process step of this invention: the completion of the metal pad (stack) structure, the preferred embodiments and preferred material stack with interlocking grid structure.

Referring to FIG. 3, in cross-sectional sketch is shown the completed metal pad (stack) structure with interlocking (islands) grid structure, the main embodiment of in this present invention. As described in the previous figure, FIG. 2. Provided are the substrate 1, insulating layer 2. The underlying copper layer 3 is depicted. The key process step to this invention is the deposition, patterning and defining special passivation interlocking structures 6 placed directly on top of the underlying copper metallurgy. Also shown in FIG. 3 is the patterned and defined barrier metal layer 10, a TaN layer, approximately from 100 to 1,000 Angstroms in thickness, placed directly on top of interlocking structures. Finally, the aluminum pad 12 layer is deposited, patterned and defined to form the top metal pad on top of the interlocking structure 6. This interlocking pad process and structure provides robust pad metal (stack) structures that having good adhesion properties (no metal or interface separation/peel failures, interface fracture failures). Since there are a large statistical number of these structures, failure rates must be very low and reliability very high, as tested by gold wire bond pull tests. Temperature and humidity cycling tests indicate the robustness of the process and structure from stress-crack corrosion, peeling, interface failure, adhesion failures, etc..

Figure 4:
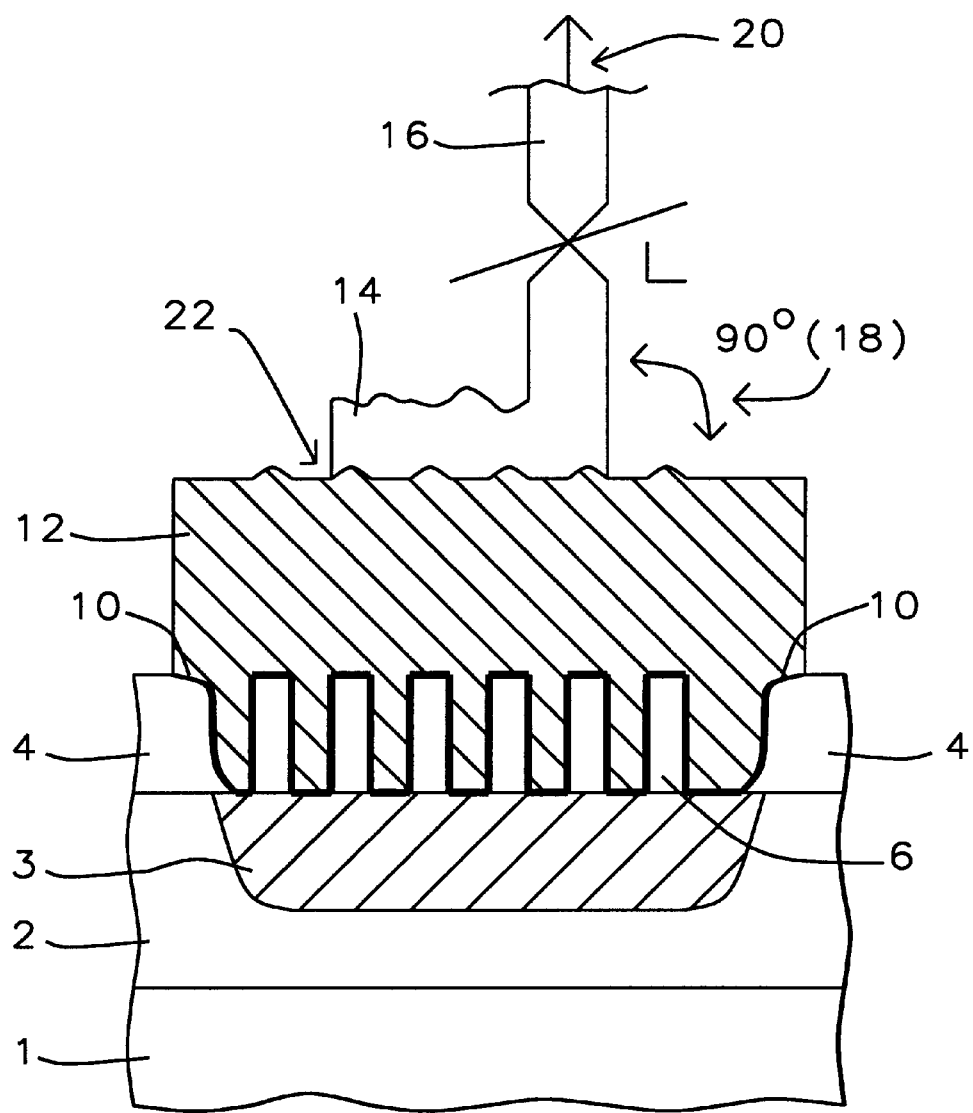
FIG. 4, which in cross-sectional representation of the metal pad region having the preferred embodiments of this invention with preferred material stack layers with interlocking grid structure, illustrating the gold tensile strength wire (bond) pull test and a gold "nugget".

Referring to FIG. 4, in cross-sectional view, is sketched a "standard" gold wire bond pull test structure that was used to evaluate the present invention's robust pad structures. For a standard pull test of metal adhesion strength (referred to as a manufacturing use test), an end portion of a 1.28 milli-inch diameter gold wire 16 was bonded 22 to the surface of the aluminum metal pad 5 and tension 20 applied thereto, at an angle of 90 degrees (18) to the surface . The diameter of the wire determines a standardized adhesion strength if the wire is broken first, at the tensile strength of the wire, before the pad is pulled away or peeled from the underlying structure. If the wire breaks (note wire necking 46) and it leaves bonded a portion called a nugget 14 attached to the pad. It is considered that sufficient bonding has been achieved to develop adhesion that can withstand repeated thermal, humidity (T&H) and/or mechanical stress of the degree encountered during the testing and manufacturing. However, if a failure occurs between the metal and any interface in the structure (by peeling, fracture, interface failure) at a force less than that required to break the wire adhesion is considered to be of a significantly low value which it will be deleterious to the reliability of the product. Wire (bond) pull tests were conducted to a large numbers of pads, to be statistically significant, to prove the robustness of the invention's process and interlocking grid (islands) structure for good adhesion properties. (Note for completeness and diligence, low power wire bonding was performed, so as note to influence the pad structure. Typical , gold wire bonding conditions are: Au wire, 1.28 mils dia., time from 10 to 36 ms, power from 90 to 130 mW, force from 20 to 40 mg, temperature of 150° C.)

In summary, the present invention is a new and improved method for fabricating aluminum metal pad structures wherein the formation of aluminum pad metal structures are described which improve adhesion between the tantalum nitride pad barrier layer and the underlying copper pad metallurgy by special interlocking grid ("islands") via structures. It is the object of the present invention to provide a process wherein a special grid of interlocking via structures is placed in between the underlying copper pad metal and the top tantalum nitride pad barrier layer providing improved adhesion to the aluminum pad metal stack structure. This unique contact pad structure provides for thermal stress relief, improved wire bond adhesion to the aluminum pad, and prevents peeling during wire bond adhesion tests.

The problem of adhesion of metal pad to underlying layers, dielectrics, and polymers in is not unique to the manufacture of multi-layer electronic circuit chips and modules, but is encountered in other technologies involved in other types of electronic elements, e.g., the formation of capacitors or even other technologies entirely unrelated to the fabrication of electrical devices. However, since the problems of loss of adhesion are of substantial economic importance at present in the fabrication of multi-layer chips and modules, the present invention is directed to silicon chip technology and IC modules, but can be easily applied to other technologies using these metal pad materials and special interlocking ("islands") grid structures.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit and other devices on a substrate, the method comprising the following steps:

providing a substrate;

providing said substrate with a layer of dielectric, termed an interlevel dielectric (ILD) over the substrate;

providing a first level of metal wiring being defined and embedded in a first layer of insulator over the layer of dielectric;

depositing a blanket of passivating dielectric layer (IMD) over the defined said first level of metal wiring;

patterning and etching the said passivating dielectric (IMD) to form special interlocking grid structures with open contact regions to underlying first level metal wiring;

depositing a blanket of a metal barrier layer;

patterning and defining the said metal barrier layer on top of the interlocking grid structures;

depositing a blanket of a metal layer for metal pad formation on top of the interlocking grid structures;

patterning and defining the said metal pad layer to form metal pads on interlocking grid structures;

repeating the above process stops to construct multilevel pad structures by this robust method to form metal pad contact structures for chips and IC's.

2. The method of claim 1, wherein said substrate is a semiconductor consisting of a single crystal of silicon.

3. The method of claim 1, wherein said layers of passivating dielectric insulating material are selected from the group consisting of insulating, refractory materials, silicon oxide, silicon nitride, silicon oxynitride and polyimides.

4. The method of claim 1, wherein said layer of first level metal wiring is composed of conducting metal copper.

5. The method of claim 1, wherein the said special interlocking grid structure composed of passivating material provide improved adhesion properties to the pad metal stack consisting of the underlying metal, metal barrier layer and top metal pad layer.

6. The method of claim 1, wherein the metal barrier layer is on top of the said interlocking grid structure and is composed of tantalum nitride, with a thickness of approximately 150 Angstroms.

7. The method of claim 1, wherein said metal layer for metal pad formation, on top of the interlocking grid structures, is composed of aluminum.

8. The method of claim 1, wherein the metal pad and interlocking grid structures consist of forming a copper underlayer, forming interlocking grid structures, forming a tantalum nitride barrier layer, and forming an aluminum pad.

9. The method of claim 1, wherein the special metal pad interlocking grid structure stack is made by a robust process and has a robust interlocking structure, increasing surface roughness and area for improved adhesion properties and can be fabricated out of conducting materials for improved conductivity.

10. The method of claim 1, wherein the conducting material layers form an interlocking metal pad structure for contacts in a wide variety of applications, selected from the group consisting of chip technology, IC module technology, and solid state devices where an integrated electrical contact is necessary.

11. The method of claim 1, wherein the process steps listed in claim 1 can be repeated to form additional levels of multilevel metal pad structures.

12. A method of fabricating an integrated circuit on a substrate, using a new and improved method for fabricating aluminum metal pad structures wherein a special interlocking grid structure, for improved adhesion, is produced by this process, the method comprising the following steps:

providing a silicon substrate or IC substrate module with integrated circuits therein;

providing said substrate with a layer of dielectric, termed an interlevel dielectric (ILD) over the substrate;

providing a first level of copper conducting wiring layer being defined and embedded in a first layer of insulator, silicon oxide, over the layer of dielectric;

depositing a blanket of passivating dielectric layer (IMD) over the defined said first level of copper conducting wiring layer;

patterning and etching the said passivating dielectric (IMD) to form special interlocking grid structures with open contact regions to underlying first level of copper conducting wiring;

depositing a blanket of a metal barrier layer, comprised of a thin layer of tantalum nitride;

patterning and defining the said metal barrier layer on top of the interlocking grid structures;

depositing a blanket of an aluminum metal layer for metal pad formation on top of the interlocking grid structures;

patterning and defining the said aluminum metal pad layer to form metal pads on interlocking grid structures;

repeating the above process steps to construct multilevel pad structures by this robust method to form interlocking metal pad contact structures for chips and IC's.

13. The method of claim 12, wherein said substrate is a semiconductor consisting of a single crystal of silicon.

14. The method of claim 12, wherein said layers of passivating dielectric insulating material are selected from the group consisting of insulating, refractory materials, silicon oxide, silicon nitride, silicon oxynitride and polyimides.

15. The method of claim 12, wherein said layer of first level metal wiring is composed of conducting metal copper.

16. The method of claim 12, wherein the said special interlocking grid structure composed of passivating material provide improved adhesion properties to the pad metal stack consisting of the underlying metal, metal barrier layer and top metal pad layer.

17. The method of claim 12, wherein the metal barrier layer is on top of the said interlocking grid structure and is composed of tantalum nitride, with a thickness of approximately 150 Angstroms.

18. The method of claim 12, wherein said metal layer for metal pad formation, on top of the interlocking grid structures, is composed of aluminum.

19. The method of claim 12, wherein the metal pad and interlocking grid structures consist of forming a copper underlayer, forming interlocking grid structures, forming a tantalum nitride barrier layer, and forming an aluminum pad.

20. The method of claim 12, wherein the special metal pad interlocking grid structure stack is made by a robust process and has a robust interlocking structure for good adhesion and conductivity, as proven by stress tests and has confirmed adhesion properties by gold wire bond pull tests, improving device, circuit reliability.

21. The method of claim 12, wherein the special metal pad interlocking grid structure stack is made by a robust process and has a robust interlocking structure, increasing surface roughness and area for improved adhesion properties and can be fabricated out of conducting materials for improved conductivity.

22. The method of claim 12, wherein the process steps listed in claim 12 can be repeated to form additional levels of multilevel metal pad structures.

23. A method of fabricating an integrated circuit on a substrate, using a unique method for fabricating aluminum metallurgy pad structure layer and lines, vias and interconnect wiring for MOSFET CMOS, memory and logic devices, and IC modules is produced by this process, the method comprising the following steps:

providing a silicon substrate or IC substrate module with integrated circuits therein;

providing said substrate with a layer of dielectric, termed an interlevel dielectric (ILD) over the substrate;

providing a first level of copper conducting wiring layer being defined and embedded in a first layer of insulator, silicon oxide, over the layer of dielectric;

depositing a blanket of passivating dielectric layer (IMD) over the defined said first level of copper conducting wiring layer;

patterning and etching the said passivating dielectric (IMD) to form special interlocking grid structures with open contact regions to underlying first level of copper conducting wiring;

depositing a blanket of a metal barrier layer, comprised of a thin layer of tantalum nitride;

patterning and defining the said metal barrier layer on top of the interlocking grid structures;

depositing a blanket of an aluminum metal layer for metal pad formation on top of the interlocking grid structures;

patterning and defining the said aluminum metal pad layer to form metal pads on interlocking grid structures;

repeating the above process steps to construct multilevel pad structures by this robust method to form reliable metal pad contact, lines and interconnect wiring structures for chips, IC's, and IC modules, thereby using the interlocking grid for robust electrical contact or contacts, lines or interconnect wiring.

24. The method of claim 23, wherein said substrate is a semiconductor consisting of a single crystal of silicon.

25. The method of claim 23, wherein said layers of passivating dielectric insulating material are selected from the group consisting of insulating, refractory materials, silicon oxide, silicon nitride, silicon oxynitride and polyimides.

26. The method of claim 23, wherein said layer of first level metal wiring is composed of conducting metal copper.

27. The method of claim 23, wherein the said special interlocking grid structure composed of passivating material provide improved adhesion properties to the pad metal stack consisting of the underlying metal, metal barrier layer and top metal pad layer.

28. The method of claim 23, wherein the metal barrier layer is on top of the said interlocking grid structure and is composed of tantalum nitride, with a thickness of approximately 150 Angstroms.

29. The method of claim 23, wherein said metal layer for metal pad formation, on top of the interlocking grid structures, is composed of aluminum.

30. The method of claim 23, wherein the metal pad and interlocking grid structures consist of forming a copper underlayer, forming interlocking grid structures, forming a tantalum nitride barrier layer, and forming an aluminum pad.

31. The method of claim 23, wherein the special metal pad interlocking grid structure stack is made by a robust process and has a robust interlocking structure, for good adhesion and conductivity, as proven by stress tests and has confirmed adhesion properties by gold wire bond pull tests, improving device, circuit reliability.

32. The method of claim 23, wherein the special metal pad interlocking grid structure stack is made by a robust process and has a robust interlocking structure, increasing surface roughness and area for improved adhesion properties and can be fabricated out of conducting materials for improved conductivity.

33. The method of claim 23, wherein the process steps listed in claim 23 can be repeated to form additional levels of multilevel bond pads.

* * * * *